(12) United States Patent
Ueda et al.

(10) Patent No.: US 7,633,590 B2
(45) Date of Patent: Dec. 15, 2009

(54) IMAGE DISPLAY DEVICE

(75) Inventors: Hiroshi Ueda, Kumamoto (JP); Hitoshi Morishita, Tokyo (JP); Shigeaki Noumi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 224 days.

(21) Appl. No.: 11/356,972

(22) Filed: Feb. 21, 2006

(65) Prior Publication Data
US 2007/0001944 A1  Jan. 4, 2007

(30) Foreign Application Priority Data
Jun. 27, 2005  (JP)  ............. 2005-185997

(51) Int. Cl.
*G02F 1/1345* (2006.01)
(52) U.S. Cl. .......... 349/149; 349/150; 349/151; 349/152; 349/187; 349/191
(58) Field of Classification Search ......... 349/149–152, 349/33, 187, 191
See application file for complete search history.

(56) References Cited

U.S. PATENT DOCUMENTS

| | | | | |
|---|---|---|---|---|
| 5,838,412 | A * | 11/1998 | Ueda et al. ............ | 349/150 |
| 5,914,763 | A * | 6/1999 | Fujii et al. ............ | 349/149 |
| 6,292,248 | B1 * | 9/2001 | Lee et al. ............ | 349/149 |
| 6,897,933 | B2 * | 5/2005 | Hoshina .............. | 349/152 |
| 7,002,657 | B2 * | 2/2006 | Hirosue et al. ........ | 349/149 |
| 7,012,814 | B2 * | 3/2006 | Sugimoto et al. ...... | 361/803 |
| 7,385,665 | B2 * | 6/2008 | Matsumoto ........... | 349/150 |
| 2002/0089634 | A1 * | 7/2002 | Aruga et al. .......... | 349/149 |

FOREIGN PATENT DOCUMENTS

| | | |
|---|---|---|
| JP | 9-179505 | 7/1997 |
| JP | 11-142871 | 5/1999 |
| JP | 3484307 | 10/2003 |
| JP | 2004-212587 | 7/2004 |

OTHER PUBLICATIONS

Japanese Patent Abstract Pub No. 11-142871 dated May 28, 1999 assigned to Casio.*
Japanese Patent Abstract Pub No. 2004-212587 dated Jul. 29, 2004 assigned to Toshiba.*

* cited by examiner

*Primary Examiner*—Brian M. Healy
*Assistant Examiner*—Guy G Anderson
(74) *Attorney, Agent, or Firm*—Oblon, Spivak, McClelland, Maier & Neustadt, L.L.P.

(57) ABSTRACT

An object of the present invention is to provide an image display device that is free from disconnection in a connection structure between given substrates even when operated in a hot and humid environment. An image display device according to a preferred embodiment of the invention has a TFT substrate and an FPC. The TFT substrate has a plurality of first terminals capable of application of potential. The FPC has second terminals that are connected respectively with the first terminals through an anisotropic conductive film and that are thicker than the first terminals. The second terminals include a high-potential terminal, a low-potential terminal, and a dummy terminal. The high-potential terminal is supplied with a relatively high potential that contributes to the display operation. The low-potential terminal is supplied with a relatively low potential that contributes to the display operation. The dummy terminal is positioned between the high-potential terminal and the low-potential terminal and is supplied with a potential not contributing to the display operation.

3 Claims, 4 Drawing Sheets

IMAGE DISPLAY DEVICE

BACKGROUND OF THE INVENTION

1. Field of the Invention

The present invention relates to image display devices, and is applicable, for example, to a connection between a TFT substrate and a flexible printed circuit in a liquid crystal display device.

2. Description of the Background Art

A liquid crystal display device using thin film transistors (TFTs) includes a TFT substrate having TFTs arranged in a matrix, a counter substrate having counter electrodes, and a layer of liquid crystal sandwiched between the TFT substrate and the opposing substrate. The TFTs are formed in the vicinities of the intersections of a plurality of gate interconnections carrying TFT turning on/off signals and a plurality of source interconnections intersecting with the gate interconnections in plan view. One pixel is formed for each TFT.

With the TFT substrate and the opposing substrate placed on each other, the periphery of the TFT substrate projects beyond the periphery of the opposing substrate. In the projecting area of the TFT substrate, a driver IC is mounted with an anisotropic conductive film (ACF) interposed therebetween. The driver IC is a circuit that controls the turning on/off of the TFTs. The ACF is a connecting material that has conducting, insulating, and adhesion functions, with conductive particles dispersed in an adhesive film.

A circuit board for controlling the driver IC is provided separately from the TFT substrate, and the TFT substrate and the circuit board are connected through a flexible printed circuit (FPC). The TFT substrate and the FPC are connected through an ACF. The connection between the TFT substrate and the FPC is made in the projecting area of the TFT substrate.

In this structure, driver IC control signals, power supply, and the like are supplied from the circuit board to the driver IC through the connection between the TFT substrate and the FPC.

An example of specific structure of the connection between the TFT substrate and the FPC in a liquid crystal display device is disclosed in Japanese Patent Application Laid-Open No. 9-179505 (1997), for example.

According to conventional techniques, a plurality of first terminals made of a thin film of metal are formed on the TFT substrate. Specifically, the first terminals are arranged like stripes on the TFT substrate. On the other hand, the FPC includes a film of polyimide and second terminals made of copper foil on the surface of the polyimide film. The thickness of the first terminals is smaller than that of the second terminals.

The first terminals are connected respectively with the second terminals to make the connection between the TFT substrate and the FPC. The ACF is placed between the first terminals and the second terminals. More specifically, conductive particles in the ACF exist between the first terminals and the second terminals and the presence of the conductive particles electrically connects the first terminals and the second terminals.

The second terminals may include high-potential terminals supplied with relatively high potential and low-potential terminals supplied with relatively low potential, which are arranged adjacent to one another.

In this structure, as mentioned above, control signals and power supply are supplied from the circuit board to the driver IC on the TFT substrate through the connection between the second terminals and the first terminals.

Suppose that a liquid crystal display device having this connection structure is operated in a hot and humid environment. Then, water will penetrate the ACF to cause the following phenomenon in thin first terminals that are connected to high-potential terminals. That is, in these first terminals, the constituent metal changes into positive ions and erodes. The eroded first terminals cause disconnection.

The thickness of the first terminals is around 1 µm or less, while the thickness of the second terminals is about 15 to 35 µm. Therefore, the thinner first terminals are more severely affected by the erosion. Also, the first terminals connected with high-potential terminals are more likely to be eroded when the potential difference between the high-potential terminals and the low-potential terminals becomes larger.

SUMMARY OF THE INVENTION

An object of the present invention is to provide an image display device that is free from disconnection in a connection structure between given substrates even when operated in a hot and humid environment.

According to a first aspect of the present invention, an image display device includes a first substrate and a second substrate. The first substrate forms a display panel and has a plurality of first terminals for making an electric connection to a part outside of the panel. The second substrate has a plurality of second terminals electrically connected to the display panel through the first terminals. The second terminals include a dummy terminal that is supplied with a dummy potential that does not contribute to the operation of the display panel.

Even when the image display device constructed as above is operated in a hot and humid environment and a higher potential is applied to the dummy terminal, it is possible to prevent erosion of the first terminals connected with the second terminals other than the dummy terminal.

According to a second aspect of the invention, an image display device includes a first substrate and a second substrate. The first substrate forms a display panel and has a plurality of first terminals for making an electric connection to a part outside of the panel. The second substrate has a plurality of second terminals electrically connected to the display panel through the first terminals. The second terminals include a dummy terminal located in a position that corresponds to none of the first terminals.

Even when the image display device constructed as above is operated in a hot and humid environment and a higher potential is applied to the dummy terminal, it is possible to prevent erosion of the first terminals connected with the second terminals.

According to a third aspect of the invention, an image display device includes a first substrate and a second substrate. The first substrate forms a display panel and has a plurality of first terminals for making an electric connection to a part outside of the panel. The second substrate has a plurality of second terminals electrically connected to the display panel through the first terminals. The second terminals include a wider-sized second terminal that is sized wider than the corresponding one of the first terminals in a direction in which the terminals are arranged side by side.

Even when a relatively high potential is applied to the wider-sized second terminal and a relatively low potential is applied to another, adjacent second terminal, the electric field caused by the potential difference between the relatively high potential and the relatively low potential does not act on the first terminal connected with the wider-sized second terminal. Accordingly, even when the image display device thus constructed is operated in a hot and humid environment, it is possible to prevent erosion of the first terminal connected to the wider-sized second terminal. This prevents disconnection in the wider-sized second terminal.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
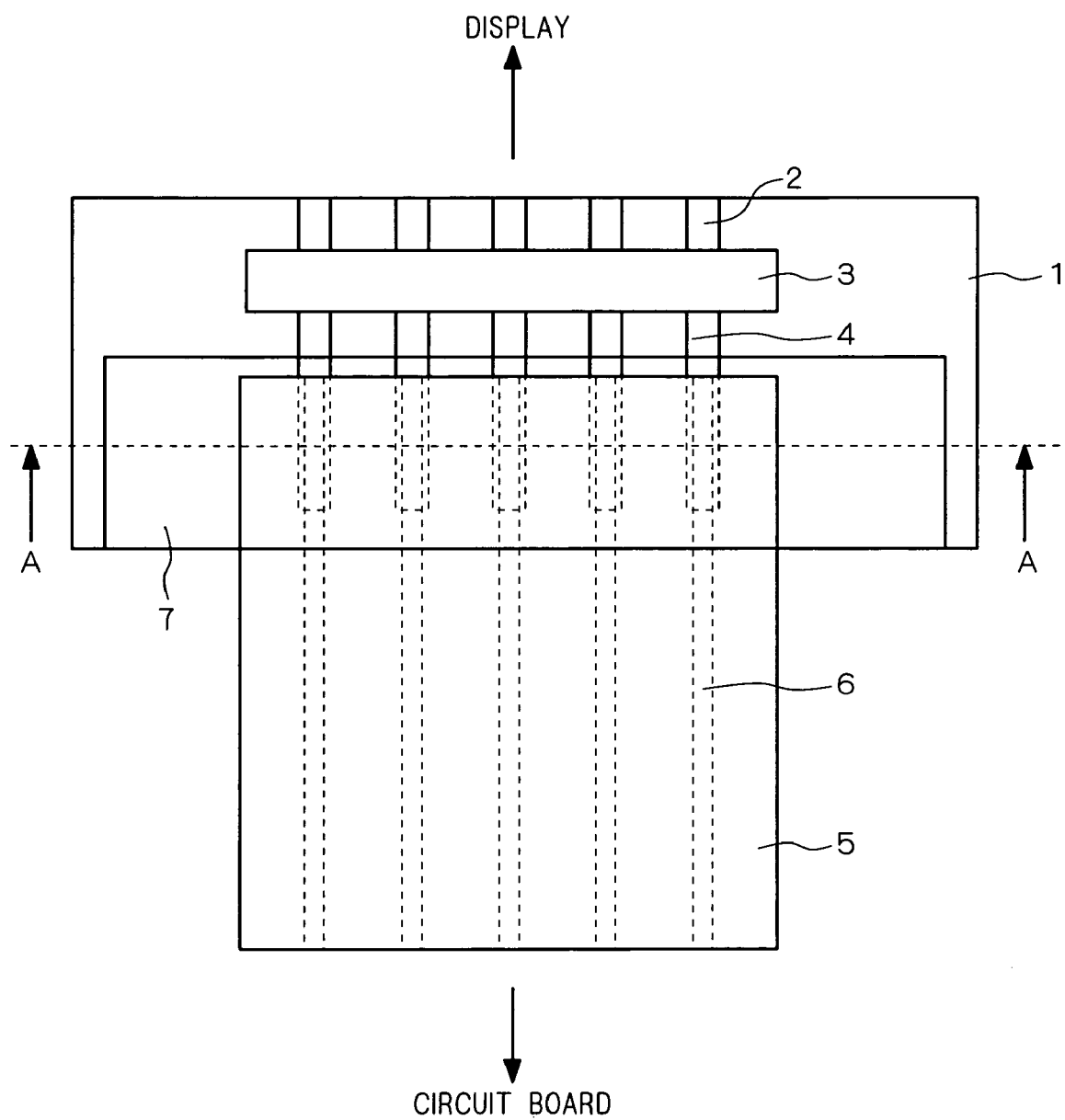
FIG. 1 is a plan view schematically showing the structure of a connection of the invention and its vicinity.

The present invention will now be specifically described referring to the drawings showing the preferred embodiments.

First Preferred Embodiment

A liquid crystal display device using thin film transistors (hereinafter referred to as TFTs) includes a TFT substrate having TFTs arranged in a matrix, a counter substrate having counter electrodes, and a layer of liquid crystal sandwiched between the TFT substrate and the opposing substrate. The TFTs are formed in the vicinities of the intersections of a plurality of gate interconnections carrying TFT turning on/off signals and a plurality of source interconnections intersecting with the gate interconnections in plan view. One pixel is formed for each TFT.

With the TFT substrate and the opposing substrate placed on each other, the periphery of the TFT substrate projects beyond the periphery of the opposing substrate. FIG. 1 is a plan view showing part of the projecting area of the TFT substrate. Specifically, FIG. 1 schematically shows the structure of a connection and its vicinity between the TFT substrate and flexible printed circuit (FPC) in a liquid crystal display device of this preferred embodiment.

In FIG. 1, the TFT substrate (which can be regarded as a first substrate) 1 forming the display panel has a plurality of interconnections (e.g., source interconnections or gate interconnections) 2. In plan view, the TFTs (not shown) are formed at the intersections of the source interconnections and gate interconnections. The TFTs are arranged in a matrix and one pixel is formed in correspondence with each TFT. The plurality of pixels form the display area (not shown).

As shown in FIG. 1, a driver IC 3 is mounted on the TFT substrate 1. The driver IC 3 is electrically connected with the interconnections 2 through an anisotropic conductive film (not shown, hereinafter referred to as ACF). The driver IC 3 is circuitry that controls the turning on/off of the TFTs. The ACF is a connecting material that has conducting, insulating, and adhesion functions, with conductive particles dispersed in an adhesive film.

Also, as shown in FIG. 1, a plurality of first terminals 4 are arranged in stripes and electrically connected with the driver IC 3. The first terminals 4 are electrically connected to the outside of the panel.

A plurality of second terminals 6 are arranged in stripes on the FPC (which can be regarded as a second substrate) 5 as shown in FIG. 1. The second terminals 6 are electrically connected to the display panel through the first terminals 4.

The FPC 5 is placed on the projecting area of the TFT substrate 1. More specifically, a part of the TFT substrate 1 and a part of the FPC 5 overlap each other in the connection area.

The first terminals 4 are connected with the second terminals 6, respectively. An ACF 7 is placed between the first terminals 4 and the second terminals 6. The first terminals 4 and the second terminals 6 are thus electrically connected with each other through conductive particles existing in the ACF 7.

In FIG. 1, portions of the first terminals 4 and portions of the second terminals 6 are placed under the FPC 5. These portions are denoted by broken lines.

The FPC 5 is connected with the TFT substrate 1 on one side and also connected with a circuit board (not shown) on the other side. The circuit board is circuitry that controls the driver IC 3. Control signals, power supply, and the like are supplied from the circuit board to the driver IC 3 on the TFT substrate 1 through the FPC 5, the second terminals 6, and the first terminals 4. That is, the first terminals 4, the second terminals 6, and the like serve to conduct electricity such as control signals, power supply, etc.

Next, the structure of the connection in the liquid crystal display device of the preferred embodiment will be described in more detail, referring to the cross-sectional view of FIG. 2 taken along line A-A in FIG. 1.

Figure 2:
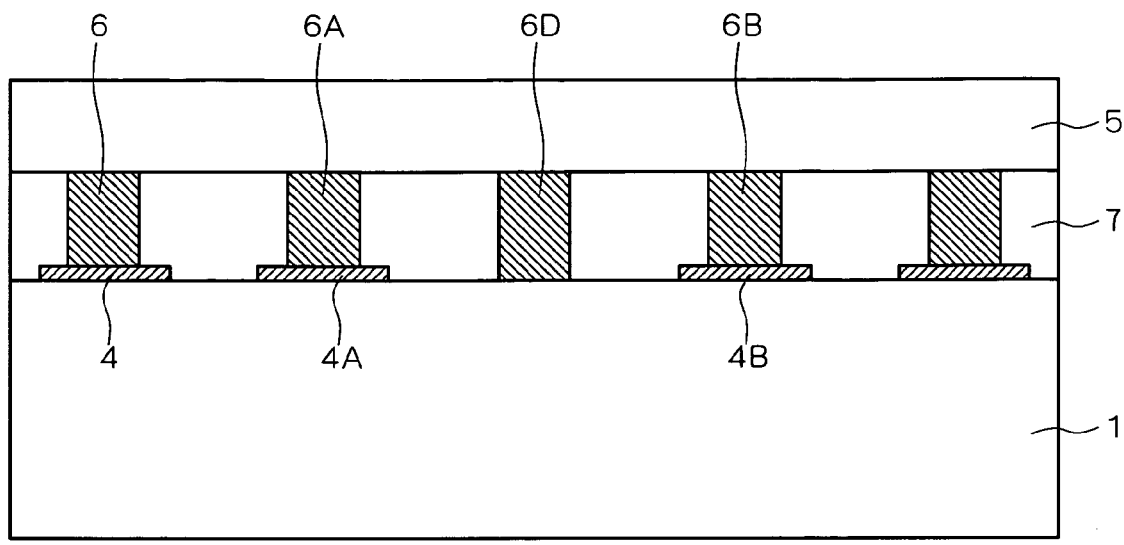
FIG. 2 is a cross-sectional view schematically showing the structure of the connection according to a first preferred embodiment.

As shown in FIG. 2, the plurality of first terminals 4 are arranged on the TFT substrate 1. The first terminals 4 are made of a thin film of metal and have a thickness of about 1 μm or less, for example.

The plurality of second terminals 6 are arranged on the FPC 5. The FPC 5 is made of polyimide, for example. The second terminals 6 are made of copper foil and have a thickness of about 15 to 35 μm, for example.

As can be seen from the description above, the second terminals 6 are thicker than the first terminals 4. Also, the second terminals 6 are connected respectively on the first terminals 4 as shown in FIG. 2.

As shown in FIG. 2, the ACF 7 is present between the TFT substrate 1 and the FPC 5. Conductive particles (not shown) dispersed in the ACF 7 are thus present between the first terminals 4 and the second terminals 6. The first terminals 4 and the second terminals 6 are electrically connected through the conductive particles.

The second terminals 6 include a high-potential terminal 6A, a low-potential terminal 6B, and a dummy terminal 6D. The dummy terminal 6D is supplied with a dummy potential that does not contribute to the operation of the display panel. The potential applied to the dummy terminal 6D is higher than the lower one of the potentials applied to the second terminals 6 placed on both sides thereof.

More specifically, the high-potential terminal 6A is a terminal that is supplied with a relatively high potential (for example, a potential higher than that applied to the low-potential terminal 6B) that contributes to the operation of the display panel. The low-potential terminal 6B is a terminal that is supplied with a relatively low potential (for example, a lower potential as compared with that applied to the high-potential terminal 6A) that contributes to the operation of the display panel. The dummy terminal 6D is placed between the high-potential terminal 6A and the low-potential terminal 6B and supplied with the dummy potential that does not contribute to the operation of the display panel.

In the example shown in FIG. 2, the dummy terminal 6D is not connected with a first terminal 4. That is, no first terminal 4 is provided in the area of the TFT substrate 1 that corresponds to the position of the dummy terminal 6D. From the above-mentioned relation between the high-potential terminal 6A and the low-potential terminal 6B, it is known that the first terminal 4A is supplied with a voltage of a higher potential than that applied to the first terminal 4B.

In the structure shown in FIG. 2, the dummy potential, which is applied to the dummy terminal 6D and which does not contribute to the operation of the display panel, has a value determined as below.

That is, when the potential applied to the high-potential terminal 6A is Va, the potential applied to the low-potential terminal 6B is Vb (Va>Vb as mentioned above), and the potential applied to the dummy terminal 6D is Vd, then the potential Vd is larger than the potential Vb (Vd>Vb). That is, a potential higher than the potential applied to the low-potential terminal 6B is applied to the dummy terminal 6D.

Effects of the liquid crystal display device of the preferred embodiment having the connection thus constructed will be described below in comparison with a conventional technique.

Figure 3:
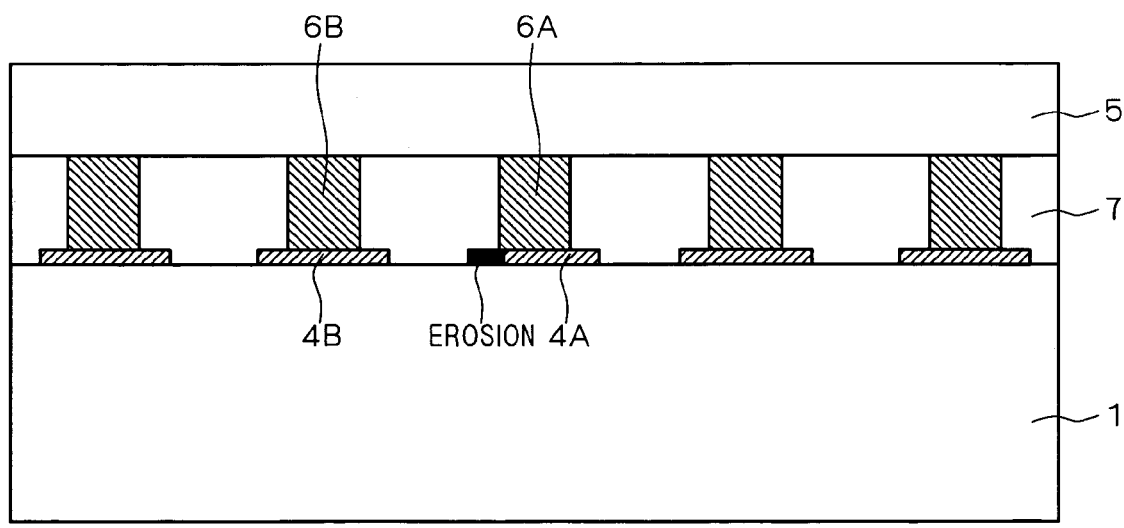
FIG. 3 is a cross-sectional view schematically showing the structure of a connection according to a conventional technique.

FIG. 3 is a cross-sectional view showing the structure of a connection constructed in a conventional manner. As can be seen by comparing FIGS. 2 and 3, the conventional connection structure does not have any dummy terminals 6D. Accordingly, all second terminals 6 are connected respectively with first terminals 4. Also, all second terminals 6 are supplied with potentials that contribute to the operation of the display panel. In the manner described above, a potential Va is applied to the high-potential terminal 6A and a potential Vb (Va>Vb) is applied to the low-potential terminal 6B.

As shown in FIG. 3, the low-potential terminal 6B is placed next to the high-potential terminal 6A. As described earlier, when the connection thus constructed is placed in a hot and humid environment, water will penetrate the ACF 7 and cause the following phenomenon in the thin first terminal 4A connected with the high-potential terminal 6A. That is, the constituent metal changes into positive ions and the first terminal 4A erodes. The eroded first terminal 4A causes disconnection.

However, this preferred embodiment provides the dummy terminal 6D. Therefore, when the dummy terminal 6D is supplied with the dummy potential that does not contribute to the operation of the display panel and that has a larger value than the potential applied to the low-potential terminal 6B, whereby the effects below are obtained.

In the structure shown in FIG. 3, an electric field due to the voltage Va−Vb is applied to the first terminal 4A. However, in the structure of FIG. 2, the electric field applied to the first terminal 4A is due to the voltage Va−Vd that is smaller than the voltage Va−Vb. That is, while the strength of the electric field applied to the first terminal 4A is large in the structure of FIG. 3, the strength of the electric field applied to the first terminal 4A is smaller in the connection structure of the preferred embodiment.

The electric field strength to the first terminal 4A is thus reduced, which prevents the erosion of the first terminal 4A even when the liquid crystal display device having the connection of the preferred embodiment is placed in a hot and humid environment. This prevents disconnection between the first terminal 4A and the second terminal 6A.

Also, suppose that the dummy terminal 6D is supplied with a potential that is equal to or higher than the higher one of the potentials applied to the second terminals 6 placed on both sides thereof. That is, the potential Vd applied to the dummy terminal 6D is equal to or higher than the potential Va applied to the high-potential terminal 6A (i.e., Vd≧Va).

When the potential Vd is thus determined, the high-potential terminal 6A is a lower-potential terminal than the dummy terminal 6D. When terminals are placed adjacent to each other, erosion does not occur in the terminal (first terminal 4) of a lower potential or in equal-potential terminals.

Accordingly, setting the potential Vd in this way prevents the erosion not only in the first terminal 4B but also in the first terminal 4A. This completely prevents disconnection between the first terminals 4 and the second terminals 6.

When the potentials are set as Vd>Va, the dummy terminal 6D is, of course, of a higher potential than the high-potential terminal 6A. However, as shown in FIG. 2, the TFT substrate 1 provides no first terminal for connection with the dummy terminal 6D. Accordingly, about the dummy terminal 6D, there is no need to consider the problem of erosion that occurs in the first terminals 4.

Figure 4:
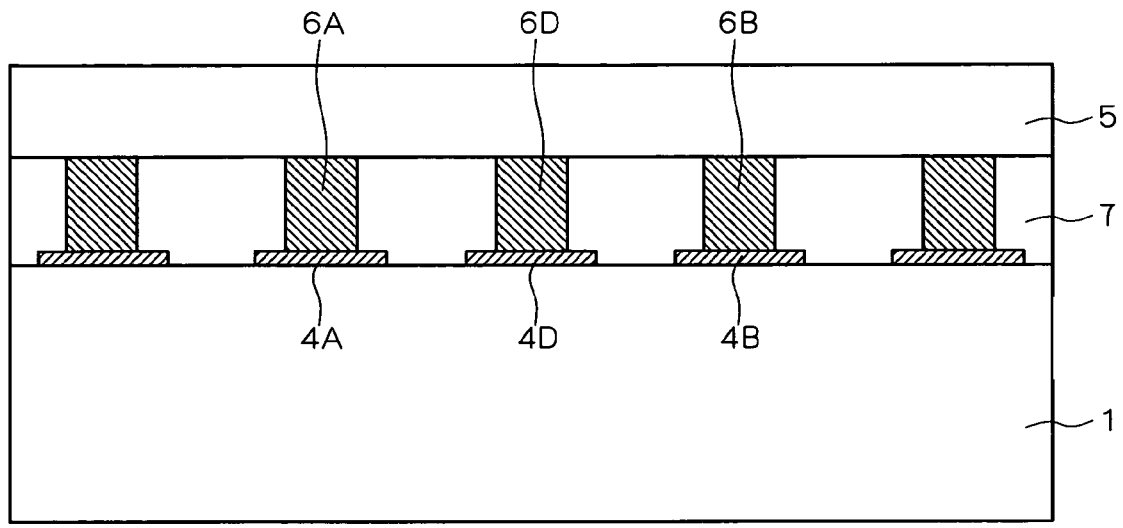
FIG. 4 is a cross-sectional view schematically showing another structure of the connection according to the first preferred embodiment.

Alternatively, as shown in FIG. 4, a first terminal 4D may be provided on the TFT substrate 1 for connection with the dummy terminal 6D.

In the structure shown in FIG. 4, the first terminal 4D will suffer erosion when the potential Vd is set larger than the potential Va as mentioned above. However, the dummy potential applied to the dummy terminal 6D does not contribute to the operation of the display panel. Therefore, even when disconnection occurs between the dummy terminal 6D and the first terminal 4D, it does not affect the operation (display) of the liquid crystal display device.

Also, in the structures shown in FIGS. 2 and 4, the dummy terminal 6D itself may suffer erosion when the potential Vd is set larger than the potential Va. However, the dummy terminal 6D has a volume that is ten times or more larger than the volume of the first terminals 4. Accordingly, the dummy terminal 6D takes a considerable time to be disconnected (which will be longer than the lifetime of the liquid crystal display device).

Even if the dummy terminal 6D disconnects, it does not affect the operation (display) of the liquid crystal display device because, as mentioned above, the potential applied to the dummy terminal 6D is a dummy potential that does not contribute to the operation of the display panel.

Second Preferred Embodiment

Figure 5:
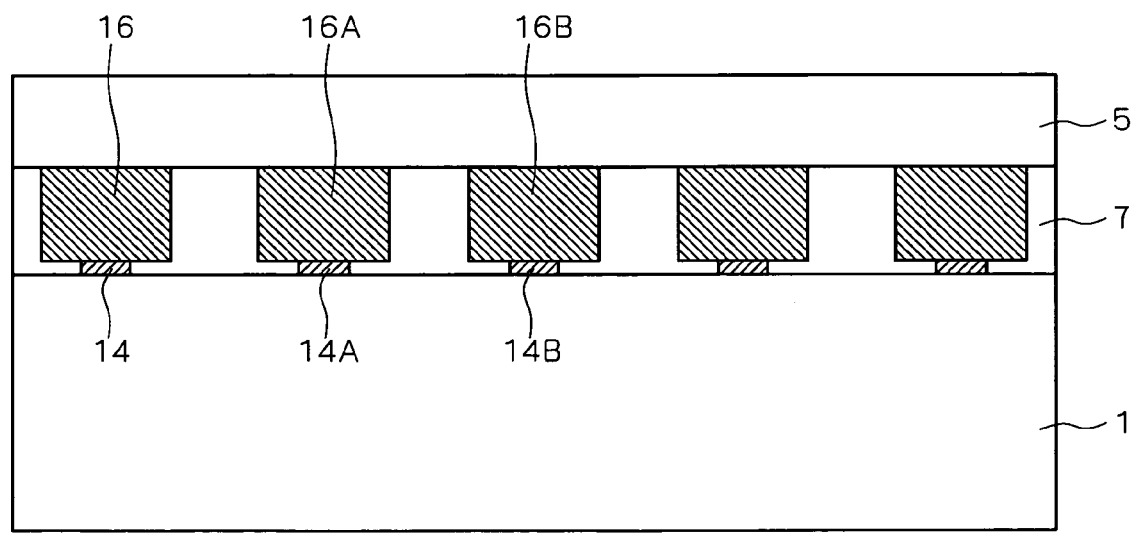
FIG. 5 is a cross-sectional view schematically showing the structure of a connection according to a second preferred embodiment.

FIG. 5 is a cross-sectional view schematically showing the structure of a connection between a TFT substrate 1 and an FPC 5 according to a second preferred embodiment.

Though not particularly described in the first preferred embodiment, the first terminals 4 arranged in stripes as shown in FIGS. 2 and 4 had a width (the lateral dimension in the diagrams) larger than the width (the lateral dimension in the diagrams) of the second terminals 6 arranged similarly in stripes.

However, in this preferred embodiment, as shown in FIG. 5, the first terminals 14 extending like stripes into the depth in the diagram have a width (the lateral dimension in the diagram) that is smaller than the width (the lateral dimension in the diagram) of the second terminals 16 extending like stripes into the depth of the diagram. That is, the second terminals 16 include second terminals that are larger in width, in the direction in which the terminals are arranged side by side, than the corresponding first terminals 14.

The connection structure of this preferred embodiment has no dummy terminal and all terminals 14 and 16 are supplied with potentials that contribute to the operation of the display panel. Accordingly, each first terminal 14 is electrically connected with the overlying second terminal 16 through conductive particles (not shown).

In other respects, the structure is the same as that of the first preferred embodiment and not described here again.

In the connection structured as shown in FIG. 5, suppose that one of the wider-sized second terminals 16 (hereinafter that second terminal 16A is referred to as a high-potential terminal 16A) is supplied with a potential higher than the potential applied to the adjacent second terminals 16. That is, suppose that the second terminal 16A is supplied with a higher potential than the second terminals 16 adjacent to the second terminal 16A. Also, suppose that the second terminal 16B is supplied with a lower potential than the second terminals 16 adjacent to the second terminal 16B (hereinafter that second terminal 16B is referred to as a low-potential terminal 16B).

Now, in this preferred embodiment, the first terminal 14A is covered by the wider-sized second terminal 16A. Accordingly, the electric field due to the voltage difference between the high-potential terminal 16A and the low-potential terminal 16B is concentrated in the high-potential terminal 16A. That is, the electric field is alleviated and hardly acts on the first terminal 14A.

Accordingly, even when the liquid crystal display device having the connection structure of this preferred embodiment is placed in a hot and humid environment, it is possible to suppress or prevent erosion of the first terminal 14A that is connected to the high-potential terminal 16A supplied with a relatively high potential.

The electric field due to the voltage difference between the high-potential terminal 16A and the low-potential terminal 16B concentrates in the high-potential terminal 16A. Therefore, when the liquid crystal display device having the connection structure of this preferred embodiment is placed in a hot and humid environment, the high-potential terminal 16A will be eroded by the electric field.

However, as described in the first preferred embodiment, the thickness of the second terminals 16 is ten times or more larger than the thickness of the first terminals 14.

Accordingly, the erosion takes a considerable time to disconnect the high-potential terminal 16A. When the thickness of the high-potential terminal 16A is around 15 to 35 µm, the high-potential terminal 16A is not disconnected within the operating lifetime of the liquid crystal display device.

In the structure shown in FIG. 5, all of the second terminals 16 are wider than the corresponding first terminals 14 in the direction in which the terminals are arranged. However, the wider-structure may be applied only to part of the second terminals 16 (see FIG. 6).

Figure 6:
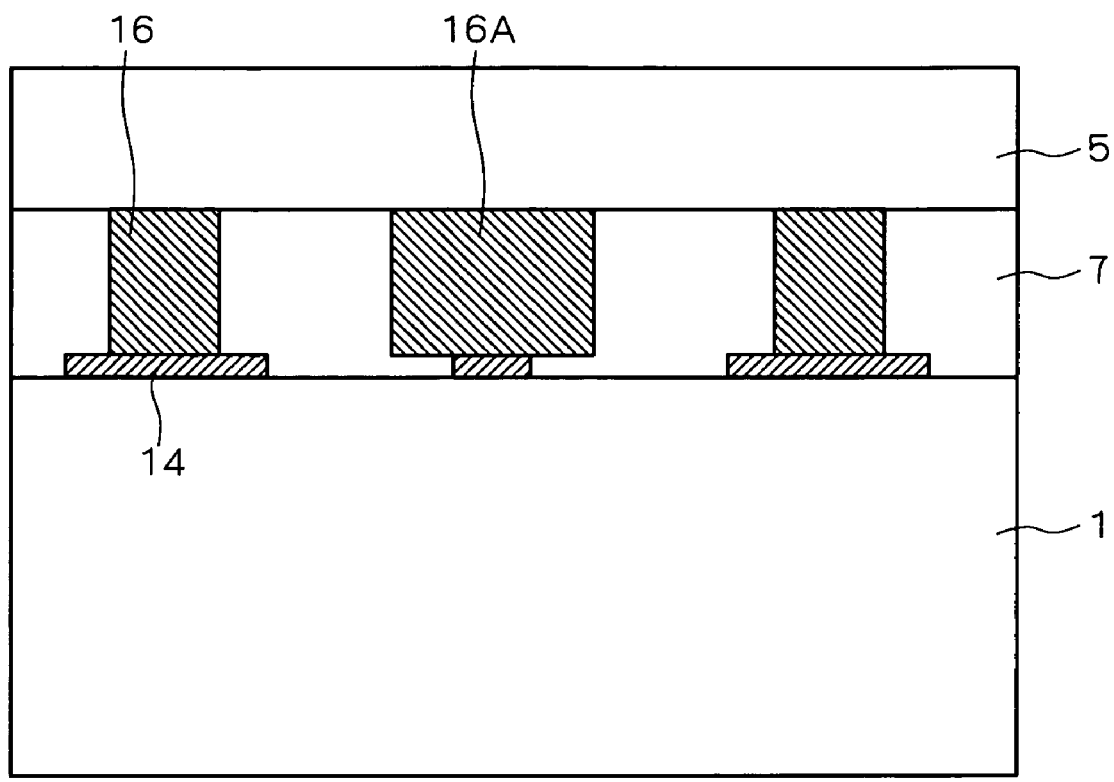
FIG. 6 is a cross-sectional view schematically showing another structure of the connection according to the second preferred embodiment.

In the structure shown in FIG. 6, suppose that the wider-sized second terminal 16A is supplied with a higher potential than the adjacent second terminal 16 (the wider-sized second terminal 16A can be regarded as a high-potential terminal 16A). In this case, as described above, it is possible to prevent breakage of the connection of the wider-sized second terminal 16A.

The structure wider than the first terminals 14 can thus be applied only to second terminals 16 that are supplied with a relatively high potential because disconnection occurs not in the lower potential terminals but in the higher potential terminals.

The first and second preferred embodiments have described applications of the connection structure of the preferred embodiments to a liquid crystal display device. However, the structures of the connection shown in FIGS. 2, 4 to 6 may be applied to image display devices using electroluminescence (EL), for example.

That is, the connection structures of the preferred embodiments are applicable to any image display devices that have a driver IC provided on a substrate and a connection structure for conducting electricity, such as signals, power supply, ground potential, etc., from the outside to the driver IC.

While the invention has been described in detail, the foregoing description is in all aspects illustrative and not restrictive. It is understood that numerous other modifications and variations can be devised without departing from the scope of the invention.

What is claimed is:

1. An image display device comprising:
   a first substrate that forms a display panel and has a plurality of first terminals for making an electric connection to a part outside of the panel;
   a second substrate that forms a flexible printed circuit and has a plurality of second terminals electrically connected to said display panel through said first terminals;
   said second terminals including a dummy terminal positioned between the first substrate and the second substrate and located in a position that corresponds to none of said first terminals;
   said first substrate having a part which overlaps a part of the second substrate; and
   an anisotropic film is placed between the first terminals and the second terminals.

2. The image display device according to claim 1, wherein said dummy terminal is supplied with a potential that is higher than a lower one of potentials applied to said second terminals placed on both sides thereof.

3. The image display device according to claim 2, wherein said potential applied to said dummy terminal is equal to or higher than a higher one of the potentials applied to said second terminals placed on both sides thereof.

* * * * *